(12) United States Patent
Xu et al.

(10) Patent No.: US 10,625,954 B2
(45) Date of Patent: Apr. 21, 2020

(54) DEVICE AND METHOD FOR GRABBING AND STORING TWO-DIMENSIONAL CODE CARD

(71) Applicant: FUJIAN LANDI COMMERCIAL EQUIPMENT CO., LTD, Fuzhou, Fujian (CN)

(72) Inventors: Zonggeng Xu, Fujian (CN); Haishan Zhang, Fujian (CN); Qiang Zhang, Fujian (CN)

(73) Assignee: FUJIAN LANDI COMMERCIAL EQUIPMENT CO., LTD, Fuzhou, Fujian (CN)

( * ) Notice: Subject to any disclaimer, the term of this patent is extended or adjusted under 35 U.S.C. 154(b) by 11 days.

(21) Appl. No.: 15/779,153

(22) PCT Filed: Aug. 12, 2016

(86) PCT No.: PCT/CN2016/094800
§ 371 (c)(1),
(2) Date: May 25, 2018

(87) PCT Pub. No.: WO2017/107503
PCT Pub. Date: Jun. 29, 2017

(65) Prior Publication Data
US 2018/0334337 A1    Nov. 22, 2018

(30) Foreign Application Priority Data
Dec. 25, 2015  (CN) .......................... 2015 1 0987645

(51) Int. Cl.
*B65G 47/91*   (2006.01)
*B65G 47/90*   (2006.01)
(Continued)

(52) U.S. Cl.
CPC ............. *B65G 47/91* (2013.01); *B65G 47/90* (2013.01); *B65G 47/901* (2013.01);
(Continued)

(58) Field of Classification Search
CPC combination set(s) only.
See application file for complete search history.

(56) References Cited

U.S. PATENT DOCUMENTS 3,690,644 A * 9/1972 Halbert ................ G06K 13/107
                                                271/98
4,866,259 A * 9/1989 Bonnemoy ............ G06K 17/00
                                                235/475
(Continued)

FOREIGN PATENT DOCUMENTS

CN    201372120 Y    12/2009
CN    103072777       5/2013
(Continued)

*Primary Examiner* — Kyle O Logan
(74) *Attorney, Agent, or Firm* — Luoh J. Wu; Continent Patent Office LLP

(57) ABSTRACT

Disclosed are a two-dimensional code card grabbing and storage device and method. The two-dimensional code card grabbing and storage device includes a horizontal base plate. First side plates and second side plates are sequentially disposed on the front side and the rear side of the horizontal base plate separately in the horizontal direction and perpendicularly fixed to the upper surface of the horizontal base plate. First baffles extending inwards are oppositely and perpendicularly disposed on the outer sides of the two first side plates, and second baffles extending inwards are oppositely and perpendicularly disposed on the inner sides of the two second side plates. A first guide plate used for storing tested two-dimensional code cards is obliquely disposed upward between the two first side plates, and a second guide plate used for storing to-be-tested two-dimensional code cards is obliquely disposed upward between the two second
(Continued)

side plates. The two-dimensional code card grabbing and storage device further comprises a grabbing plate with one side attached with a nano micro-suction material and the other side fixedly connected with a mechanical claw controlled by a mechanical claw driving mechanism. The present invention has the beneficial effect of sequentially grabbing, discharging, sorting and storing two-dimensional code cards.

6 Claims, 2 Drawing Sheets

(51) Int. Cl.
*G06K 13/02* (2006.01)
*G01R 31/28* (2006.01)

(52) U.S. Cl.
CPC ....... *B65G 47/905* (2013.01); *G01R 31/2893* (2013.01); *G06K 13/02* (2013.01); *B65G 2201/022* (2013.01); *G08C 2201/20* (2013.01)

(56) References Cited

U.S. PATENT DOCUMENTS

| 2003/0178987 A1* | 9/2003 | Suzuki | B23Q 7/1442 324/756.03 |
| 2014/0069772 A1* | 3/2014 | Flach | B65H 1/02 198/347.3 |
| 2016/0304303 A1* | 10/2016 | Allen | B65H 1/04 |

FOREIGN PATENT DOCUMENTS

| CN | 103854033 | 6/2014 |
| CN | 204280687 U | 4/2015 |
| CN | 105417147 A | 3/2016 |
| EP | 2441709 A1 | 4/2012 |

* cited by examiner

DEVICE AND METHOD FOR GRABBING AND STORING TWO-DIMENSIONAL CODE CARD

BACKGROUND OF THE INVENTION

1. Technical Field

The present invention relates to the field of two-dimensional code testing, in particular to a two-dimensional code card grabbing and storage device and method.

2. Description of Related Art

At present, electronic payment based on two-dimensional codes is becoming more and more popular. The key of successful payment lies in the recognition rate of cameras, and thus the capacity to recognize two-dimensional codes with a large quantity of different information, gray scales and completeness levels of cameras needs to be tested. In order to achieve automatic testing, a device must be designed for storing, grabbing, discharging and automatically testing two-dimensional code cards (the two-dimensional code cards refer to IC cards printed with two-dimensional codes). In the prior art, vacuum chucks or mechanical clamping devices were mainly used for grabbing two-dimensional code cards, but certain power resources are needed, increasing equipment costs and reducing the moving flexibility of the device.

Nano micro-suction materials are a new generation of glue materials recently developed based on the following principle. The reason why geckoes can resist earth's gravity and cling to the surfaces of objects is that tiny villi, called bristles, are densely grown on the feet of the geckoes and hundreds or thousands of protrusions with diameter of 0.25 microns exist at the tail end of each bristle. This fine structure makes the bristles extremely close to surface molecules of objects on which the geckoes climb, and thus molecular attraction is generated. Based on this principle, the nano micro suction materials can firmly create suction on flat and smooth rigid objects when touching the flat and smooth rigid objects.

BRIEF SUMMARY OF THE INVENTION

To overcome the defects mentioned above, the present invention provides a two-dimensional code card grabbing and storage device and method, which can sequentially grab, discharge, sort and store two-dimensional code cards.

A two-dimensional code card grabbing and storage device comprises a horizontal base plate. First side plates and second side plates are sequentially disposed on the front side and the rear side of the horizontal base plate separately in the horizontal direction and perpendicularly fixed to the upper surface of the horizontal base plate. The first side plates are lower than the second side plates. First baffles extending inwards are oppositely and perpendicularly disposed on the outer sides of the two first side plates, and second baffles extending inwards are oppositely and perpendicularly disposed on the inner sides of the two second side plates. A first guide plate used for storing tested two-dimensional code cards is upward obliquely disposed between the two first side plates, and a second guide plate used for storing to-be-tested two-dimensional code cards is obliquely disposed upward between the two second side plates. The two-dimensional code card grabbing and storage device further comprises a grabbing plate used for grabbing the to-be-tested two-dimensional code cards. A nano microsuction material adheres to one side of the grabbing plate, and the other side of the grabbing plate is fixedly connected with a mechanical claw controlled by a mechanical claw driving mechanism. The mechanical claw is disposed beside the second side plates. The distance between the two first baffles and the distance between the two second baffles are greater than the width of the grabbing plate and smaller than the width of the two-dimensional code cards.

Furthermore, one end of the first guide plate is obliquely fixed upward to the two first baffles, and one end of the second guide plate is obliquely fixed upward to the two second baffle. The two sides of the first guide plate are fixedly connected with the inner side faces of the two first side plates, and the two sides of the second guide plate are fixedly connected with the inner side faces of the two second side plates.

Furthermore, the first guide plate is fixed between the bottoms of the two first side plates, and the second guide plate is fixed between the middle portions of two second side plates.

Furthermore, the first side plates located on the front side of the horizontal base plate are disposed adjacently, the second side plates located on the rear side of the horizontal base plate are disposed adjacently, and the inner sides of the two first side plates are connected with the outer sides of the two second baffles.

Furthermore, the first side plates and the second side plates are fixed to the horizontal base plate through bolts, the two first baffles are perpendicularly fixed to the two first side plates through bolts, and the two second baffles are perpendicularly fixed to the two second side plates through bolts.

The present invention further provides a grabbing and storage method of the two-dimensional code card grabbing and storage device. The grabbing and storage method comprises the following steps:

Step S1, the grabbing plate is fixed to the mechanical claw, and the mechanical claw is driven by the mechanical claw driving mechanism to drive the grabbing plate to move to a position beside the second side plates;

Step S2, the grabbing plate is moved by the mechanical claw driving mechanism to a position above the second guide plate where the two-dimensional code cards are stacked so as to grab the two-dimensional code cards;

Step S3, the grabbing plate grabs the uppermost two-dimensional code card on the second guide plate through the nano microsuction material;

Step S4, the grabbing plate is moved by the mechanical claw driving mechanism to a position in front of a test device after grabbing the uppermost two-dimensional code card, and then the two-dimensional code is tested;

Step S5, after the two-dimensional code is tested, the grabbing plate is moved by the mechanical claw driving mechanism to a position above the two first side plates to be matched with the first baffles, the two-dimensional code card is clamped between the two first baffles, and the grabbing plate is driven by the mechanical claw driving mechanism to make the two-dimensional code card fall onto the first guide plate from the grabbing plate; and Step S6, whether all the two-dimensional code cards are grabbed or not is observed; if yes, the test is ended; or if not, Step S2 is performed.

Compared with the prior art, the present invention has the following beneficial effects:

According to the present invention, a two-dimensional code card storage bin is defined by two first side plates and two first baffles, a two-dimensional code card discharge bin is defined by two second side plates and two second baffles, a first guide plate is used for storing tested two-dimensional code cards, a second guide plate is used for storing to-be-tested two-dimensional code cards, and the first guide plate and the second guide plates are disposed obliquely, so that the two-dimensional code cards are sorted automatically under the effect of gravity. In addition, the distance between the two first baffles and the distance between the two second baffles are greater than the width of a grabbing plate and smaller than the width of the two-dimensional code cards, so that the tested two dimensional code cards are separated from the grabbing plate under the effect of the first baffles and a mechanical claw driving mechanism. When close to the two-dimensional code cards, the grabbing plate can automatically grab the two-dimensional code cards through a nano micro suction material on the grabbing plate.

BRIEF DESCRIPTION OF THE SEVERAL VIEWS OF THE DRAWINGS

The present invention is further described with the drawings as follows.

In the FIGs: 1—horizontal base plate, 2—first side plate, 3—second side plate, 4—first baffle, 5—second baffle, 6—first guide plate, 7—second guide plate, 8—grabbing plate, 9—nano microsuction material, 10—two-dimensional code card.

DETAILED DESCRIPTION OF THE INVENTION

A further description of the present invention is given as follows with the drawings and specific embodiment.

Figure 1:
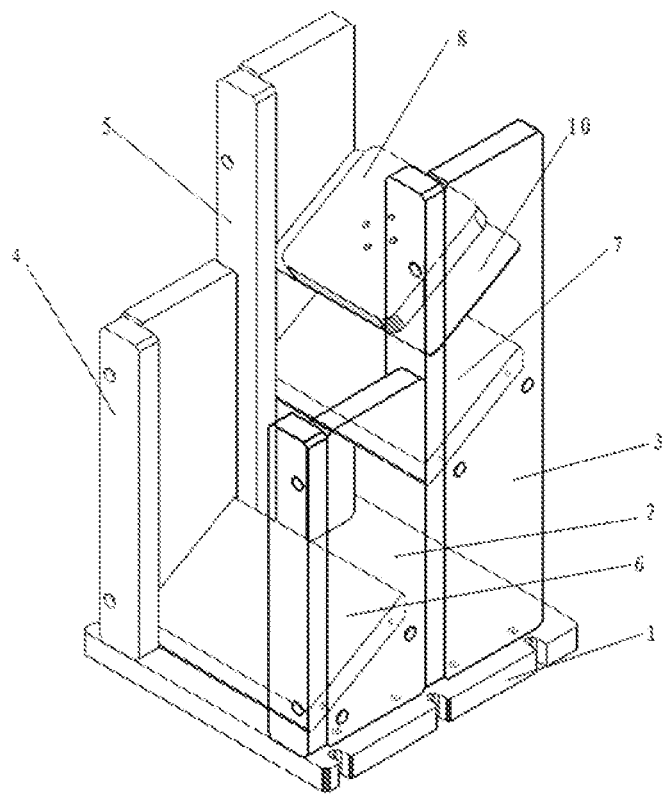
FIG. 1 is a structural diagram of a grabbing and storage device in one embodiment of the present invention.
Figure 2:
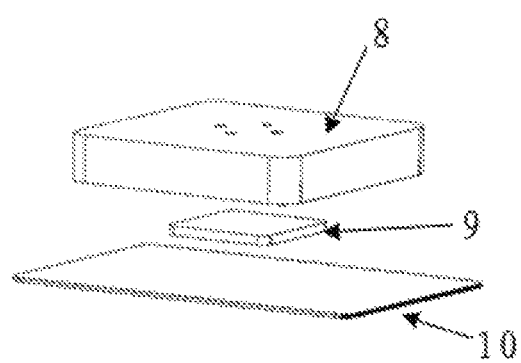
FIG. 2 is a structural diagram of a grabbing plate and a two-dimensional code card matched with each other in one embodiment of the present invention.

As is shown in FIG. 1 and FIG. 2, a two-dimensional code card 10 grabbing and storage device comprises a horizontal base plate 1. First side plates 2 and second side plates 3 are sequentially disposed on the front side and the rear side of the horizontal base plate 1 separately in the horizontal direction and perpendicularly fixed to the upper surface of the horizontal base plate 1. The first side plates 2 are lower than the second side plates 3. First baffles 4 extending inwards are oppositely and perpendicularly disposed on the outer sides of the two first side plates 2, and second baffles 5 extending inwards are oppositely and perpendicularly disposed on the inner sides of the two second side plates 3. A first guide plate 6 used for storing tested two-dimensional code cards 10 is upward obliquely disposed between the two first side plates 2, and a second guide plate 7 used for storing to-be-tested two-dimensional code cards 10 is obliquely disposed upward between the two second side plates 3. The two-dimensional code card grabbing and storage device further comprises a grabbing plate 8 used for grabbing the to-be-tested two-dimensional code cards 10. A nano microsuction material 9 adheres to one side of the grabbing plate 8, and the other side of the grabbing plate 8 is fixedly connected with a mechanical claw controlled by a mechanical claw driving mechanism. The mechanical claw is disposed beside the second side plates 3. The distance between the two first baffles 4 and the distance between the two second baffles 5 are greater than the width of the grabbing plate 8 and smaller than the width of the two-dimensional code cards 10.

From the above description, the present invention has the following beneficial effects: The first guide plate is used for storing the tested two-dimensional code cards 10, the second guide plate is used for storing the to-be-tested two-dimensional code cards 10, and the first guide plate and the second guide plate are disposed obliquely, so that the two-dimensional code cards 10 are sorted automatically under the effect of gravity. Furthermore, the distance between the two first baffles 4 and the distance between the two second baffles 5 are greater than the width of the grabbing plate 8 and smaller than the width of the two-dimensional code cards 10, so that the tested two-dimensional code cards are separated from the grabbing plate 8 under the effect of the first baffles 4 and the mechanical claw driving mechanism. The grabbing plate 8 can automatically grab the two-dimensional code cards 10 through the nano micro suction material 9 on the grabbing plate 8 when close to the two-dimensional code cards 10. The grabbing plate 8 is controlled by a small existing universal three-coordinate robot comprising a mechanical claw capable of moving in the X-axis direction, Y-axis direction and Z-axis direction and a mechanical claw driving mechanism used for driving the mechanical claw.

The nano microsuction material 9 adheres to one side of the grabbing plate 8 through fixing glue and is a nano micro-suction tape.

Furthermore, in this embodiment, one end of the first guide plate 6 is obliquely fixed upward to the two first baffles 4, and one end of the second guide plate 7 is obliquely fixed upward to the two second baffle 5. The two sides of the first guide plate 6 are fixedly connected with the inner side faces of the two first side plates 2, and the two sides of the second guide plate 7 are fixedly connected with the inner side faces of the two second side plates 3.

In this embodiment, the first guide plate 6 is fixed between the bottoms of the two first side plates 2, and the second guide plate 7 is fixed between the middle portions of two second side plates 3.

In this embodiment, the first side plates 2 located on the front side of the horizontal base plate 1 are disposed adjacently, the second side plates 3 located on the rear side of the horizontal base plate 1 are disposed adjacently, and the inner sides of the two first side plates 2 are connected with the outer sides of the two second baffles 5.

In this embodiment, the first side plates 2 and the second side plates 3 are fixed to the horizontal base plate 1 through bolts, the two first baffles 4 are perpendicularly fixed to the two first side plates 2 through bolts, and the two second baffles 5 are perpendicularly fixed to the two second side plates 3 through bolts.

The present invention further provides a grabbing and storage method of the two-dimensional code card 10 grabbing and storage device. The grabbing and storage method comprises the following steps:

Step S1, the grabbing plate 8 is fixed to the mechanical claw, and the mechanical claw is driven by the mechanical claw driving mechanism to drive the grabbing plate 8 to move to a position beside the second side plates 3;

Step S2, the grabbing plate 8 is moved by the mechanical claw driving mechanism to a position above the second guide plate 7 where the two-dimensional code cards 10 are stacked 10 so as to grab the two-dimensional code cards 10;

Step S3, the grabbing plate 8 grabs the uppermost two-dimensional code card 10 on the second guide plate 7 through the nano microsuction material 9;

Step S4, the grabbing plate 8 is moved by the mechanical claw driving mechanism to a position in front of a test device after grabbing the uppermost two-dimensional code card 10, and then the two-dimensional code is tested;

Step S5, after the two-dimensional code is tested, the grabbing plate 8 is moved by the mechanical claw driving mechanism to a position above the two first side plates 2 to be matched with the first baffles 4, the two-dimensional code card 10 is clamped between the two first baffles 4, and the grabbing plate 8 is driven by the mechanical claw driving mechanism to make the two-dimensional code card 10 fall onto the first guide plate 6 from the grabbing plate 8; and Step S6, whether all the two-dimensional code cards 10 are grabbed or not is observed; if yes, the test is ended; or if not, Step S2 is performed.

Figure 3:
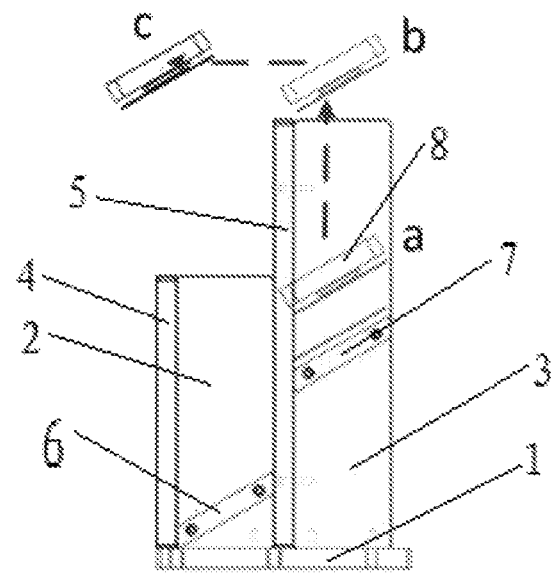
FIG. 3 is diagram of the grabbing process of a grabbing and storage method in one embodiment of the present invention.

The specific implementation process of the present invention is as follows. As is shown in FIG. 3, the two-dimensional code card 10 is grabbed, specifically, a two-dimensional code card 10 storage bin is defined by the two first side plates 2 and the two first baffles 4, and a two-dimensional code card 10 discharge bin is defined by the two second side plates 3 and the two second baffles 5; the grabbing plate 8 is moved by the mechanical claw to a position a (namely the position between the two second side plates 3) of the two-dimensional code card 10 discharge bin, the nano microsuction material 9 on the grabbing plate 8 is stuck to the two-dimensional code card 10 located on the second guide plate 7, the grabbing plate 8 is then moved by the mechanical claw to a position b above the second side plates 3, and thus the to-be-tested two-dimensional code card 10 is grabbed without a grabbing power source. Afterwards, the two-dimensional code card 10 is moved to a position in front of the test device, and then the two-dimensional code is tested. After the two-dimensional code is tested, the tested two-dimensional code card 10 is moved by the mechanical claw to a position c beside the first side plates 2.

Figure 4:
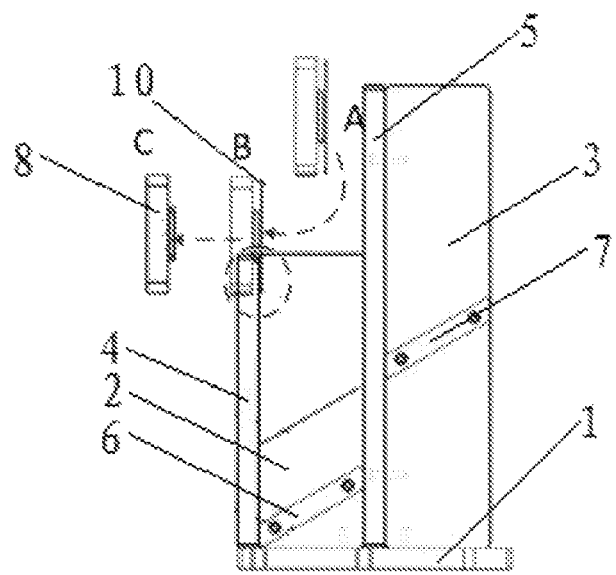
FIG. 4 is a diagram of the storage process of the grabbing and storage method in one embodiment of the present invention.

As is shown in FIG. 4, the two-dimensional code card 10 is stored, specifically, the tested two-dimensional code card 10 is stored by moving the grabbing plate 8 from a position A, to a position B and finally to a position C by the mechanical claw; at the position B, the width of the two-dimensional code card 10 is greater than the distance between the two first baffles 4 while the width of the grabbing plate 8 is smaller than the distance between the two first baffles 4, so that when the grabbing plate 8 passes between the two first baffles 4, the two-dimensional code card 10 will be blocked in the two-dimensional code card 10 storage bin by the first baffles 4, and thus the tested two-dimensional code card 10 is discharged; and the two-dimensional code card 10 passes through the first guide plate 6 when falling down and then can be placed in the two-dimensional code card 10 storage bin in order under the effect of the upward inclined first guide plate 6, and thus the tested two-dimensional code cards 10 are automatically sorted.

In conclusion, the two-dimensional grabbing and storage device and method of the present invention can grab two-dimensional code cards without grabbing power and can also discharge and automatically sort tested two-dimensional code cards.

The purposes, technical scheme and advantages of the present invention are further described in detail with the preferred embodiment mentioned above. It would appreciate that the embodiment mentioned above is only one preferred embodiment of the present invention and is not used for limiting the present invention, and any modification, equivalent substitute and improvement made based on the spirit and principle of the present invention should fall within the protection scope of the present invention.

What is claimed is:

1. A two-dimensional code card grabbing and storage device, characterized by comprising
   a horizontal base plate;
   first side plates and second side plates sequentially disposed on a front side and a rear side of the horizontal base plate separately in the horizontal direction and perpendicularly fixed to an upper surface of the horizontal base plate, the first side plates being lower than the second side plates;
   two first baffles extending inwards are oppositely and perpendicularly disposed on outer sides of the two first side plates; and
   two second baffles extending inwards are oppositely and perpendicularly disposed on inner sides of the two second side plates;
   a first guide plate used for storing tested two-dimensional code cards is obliquely disposed upward between the two first side plates; and
   a second guide plate used for storing to-be-tested two-dimensional code cards is obliquely disposed upward between the two second side plates;
   wherein the two-dimensional code card grabbing and storage device further comprises a grabbing plate used for grabbing the to-be-tested two-dimensional code cards, a nano micro-suction material adheres to one side of the grabbing plate, and the other side of the grabbing plate is fixedly connected with a mechanical claw controlled by a mechanical claw driving mechanism; the mechanical claw is disposed beside the second side plates, and the distance between the two first baffles and the distance between the two second baffles are greater than the width of the grabbing plate and smaller than the width of the two-dimensional code cards.

2. The two-dimensional code card grabbing and storage device according to claim 1, characterized in that one end of the first guide plate is obliquely fixed upward to the two first baffles, one end of the second guide plate is obliquely fixed upward to the two second baffles, two sides of the first guide plate are fixedly connected with inner side faces of the two first side plates, and two sides of the second guide plate are fixedly connected with inner side faces of the two second side plates.

3. The two-dimensional code card grabbing and storage device according to claim 2, characterized in that the first guide plate is fixed between bottoms of the two first side plates, and the second guide plate is fixed between middle portions of the two second side plates.

4. The two-dimensional code card grabbing and storage device according to claim 1, characterized in that the first side plates located on the front side of the horizontal base plate are disposed adjacently, the second side plates located on the rear side of the horizontal base plate are disposed adjacently, and the inner sides of the two first side plates are connected with outer sides of the two second baffles.

5. The two-dimensional code card grabbing and storage device according to claim 1, characterized in that the first side plates and the second side plates are fixed to the horizontal base plates through bolts, the two first baffles are perpendicularly fixed to the two first side plates through bolts, and the two second baffles are perpendicularly fixed to the two second side plates through bolts.

6. A grabbing and storage method of the two-dimensional code card grabbing and storage device according to claim 1, characterized by comprising the following steps:
   Step S1, fixing the grabbing plate to the mechanical claw, and driving, by the mechanical claw driving mechanism, the mechanical claw to drive the grabbing plate to a position beside the second side plates;
   Step S2, moving, by the mechanical claw driving mechanism, the grabbing plate to a position above the second guide plate where the two-dimensional code cards are stacked to grab the two-dimensional code cards;
   Step S3, grabbing, by the grabbing plate, the uppermost two-dimensional code card on the second guide plate through the nano micro-suction material;
   Step S4, after the uppermost two-dimensional code card is grabbed, moving, by the mechanical claw driving mechanism, the grabbing plate to a position in front of a test device, and testing a two-dimensional code;
   Step S5, after the two-dimensional code card is tested, moving, by the mechanical claw driving mechanism, the grabbing plate to a position above the two first side plates, enabling the grabbing plate to be matched with the first baffles, clamping the two-dimensional code card between the two first baffles, and driving, by the mechanical claw driving mechanism, the grabbing plate to make the two-dimensional code card fall onto the first guide plate from the grabbing plate; and
   Step S6, observing whether all the two-dimensional code cards are grabbed or not; if yes, ending the test; or if not, performing Step S2.

\* \* \* \* \*